United States Patent
Zhou et al.

(10) Patent No.: US 12,014,050 B2
(45) Date of Patent: Jun. 18, 2024

(54) ADAPTIVE TIME SENSE PARAMETERS AND OVERDRIVE VOLTAGE PARAMETERS FOR RESPECTIVE GROUPS OF WORDLINES IN A MEMORY SUB-SYSTEM

(71) Applicant: Micron Technology, Inc., Boise, ID (US)

(72) Inventors: Zhenming Zhou, San Jose, CA (US); Ching-Huang Lu, Fremont, CA (US); Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/889,836

(22) Filed: Aug. 17, 2022

(65) Prior Publication Data

US 2024/0061583 A1 Feb. 22, 2024

(51) Int. Cl.
*G06F 3/06* (2006.01)

(52) U.S. Cl.
CPC .......... *G06F 3/0611* (2013.01); *G06F 3/0629* (2013.01); *G06F 3/0679* (2013.01)

(58) Field of Classification Search
CPC ..... G06F 3/0611; G06F 3/0629; G06F 3/0679
USPC ........................................................ 711/154
See application file for complete search history.

(56) References Cited

U.S. PATENT DOCUMENTS

| | | | | |
|---|---|---|---|---|
| 2019/0004734 A1* | 1/2019 | Kirshenbaum | ....... | G06F 3/0679 |
| 2022/0214398 A1* | 7/2022 | Hu | ..................... | G01R 31/2621 |
| 2022/0270680 A1* | 8/2022 | Narku-Tetteh | ..... | G11C 13/0097 |
| 2023/0062048 A1* | 3/2023 | Goode | ................ | G06F 11/1008 |
| 2023/0186985 A1* | 6/2023 | Husain | ................. | G11C 13/004 |
| | | | | 365/163 |

* cited by examiner

*Primary Examiner* — Than Nguyen
(74) *Attorney, Agent, or Firm* — Lowenstein Sandler LLP

(57) ABSTRACT

A system includes a memory device and a processing device, operatively coupled with the memory device, to perform operations including: receiving a request to perform a memory access operation on a set of cells associated with a wordline of the memory device; determining that the wordline is disposed on a first deck of the memory deck; responsive to determining that the wordline is disposed on the first deck, determining that the wordline is associated with a first group of wordlines associated with the first deck; and responsive to determining that the wordline is associated with the first group of wordlines associated with the first deck, performing the memory access operation on the set of cells connected to the wordline using a first time sense parameter, wherein the first time sense parameter corresponds to the first group of wordlines associated with the first deck.

20 Claims, 7 Drawing Sheets

200

| Category 201 | Parameters 203 | Notes 205 |
|---|---|---|
| Adaptive Time Sense Parameter 201a | Parameter_1ˢᵗDeck_Sense 203a | Adaptive time sense parameters for 1ˢᵗ Deck |
| | Parameter_1ˢᵗDeck_Sense 203b | |
| | Parameter_1ˢᵗDeck_Sense 203c | |
| | Parameter_1ˢᵗDeck_Sense 203d | |
| | Parameter_2ⁿᵈDeck_Sense 203e | Adaptive time sense parameters for 2ⁿᵈ Deck |
| | Parameter_2ⁿᵈDeck_Sense 203f | |
| | Parameter_2ⁿᵈDeck_Sense 203g | |
| | Parameter_2ⁿᵈDeck_Sense 203h | |
| Adaptive Overdrive Voltage Parameter 201b | Parameter_1ˢᵗDeck_Overdrive 203aa | Adaptive overdrive voltage parameters for 1ˢᵗ Deck |
| | Parameter_1ˢᵗDeck_Overdrive 203bb | |
| | Parameter_1ˢᵗDeck_Overdrive 203cc | |
| | Parameter_2ⁿᵈDeck_Overdrive 203dd | Adaptive overdrive voltage parameters for 2ⁿᵈ Deck |
| | Parameter_2ⁿᵈDeck_Overdrive 203ee | |
| | Parameter_2ⁿᵈDeck_Overdrive 203ff | |

| Category 201 | Parameters 203 | Notes 205 |
|---|---|---|
| Adaptive Time Sense Parameter 201a | Parameter_1stDeck_Sense 203a | Adaptive time sense parameters for 1st Deck |
| | Parameter_1stDeck_Sense 203b | |
| | Parameter_1stDeck_Sense 203c | |
| | Parameter_1stDeck_Sense 203d | |
| | Parameter_2ndDeck_Sense 203e | Adaptive time sense parameters for 2nd Deck |
| | Parameter_2ndDeck_Sense 203f | |
| | Parameter_2ndDeck_Sense 203g | |
| | Parameter_2ndDeck_Sense 203h | |
| Adaptive Overdrive Voltage Parameter 201b | Parameter_1stDeck_Overdrive 203aa | Adaptive overdrive voltage parameters for 1st Deck |
| | Parameter_1stDeck_Overdrive 203bb | |
| | Parameter_1stDeck_Overdrive 203cc | |
| | Parameter_2ndDeck_Overdrive 203dd | Adaptive overdrive voltage parameters for 2nd Deck |
| | Parameter_2ndDeck_Overdrive 203ee | |
| | Parameter_2ndDeck_Overdrive 203ff | |

FIG. 2

ADAPTIVE TIME SENSE PARAMETERS AND OVERDRIVE VOLTAGE PARAMETERS FOR RESPECTIVE GROUPS OF WORDLINES IN A MEMORY SUB-SYSTEM

TECHNICAL FIELD

Embodiments of the disclosure relate generally to memory sub-systems, and more specifically, relate to adaptive time sense parameters and overdrive voltage parameters for respective groups of wordlines in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a diagram of an example configuration table of a memory device, in accordance with some embodiments of the present disclosure.

DETAILED DESCRIPTION

Figure 1:
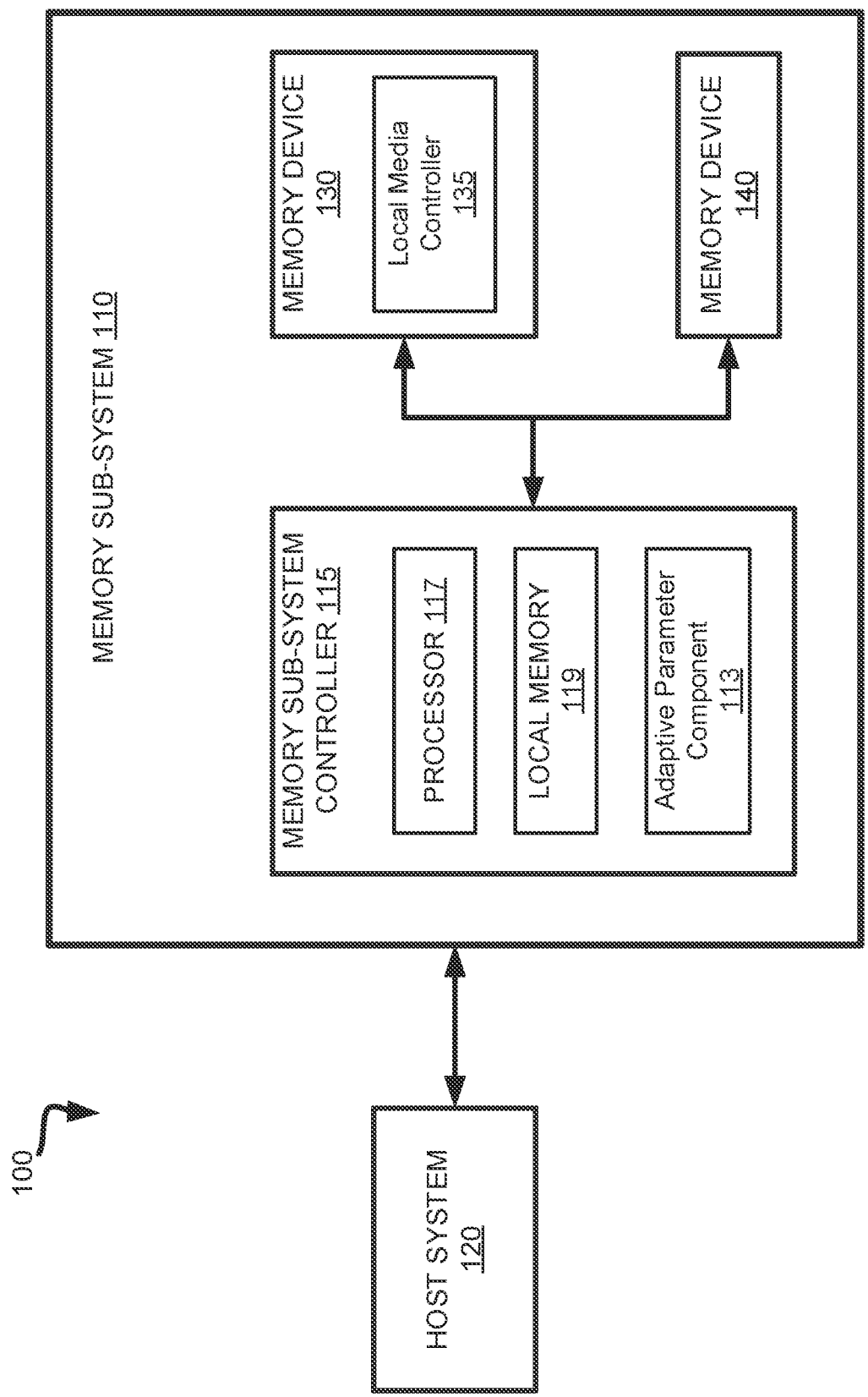
FIG. 1 illustrates an example computing system that includes a memory sub-system, in accordance with some embodiments of the present disclosure.

Aspects of the present disclosure are directed to adaptive time sense parameters and overdrive voltage parameters for respective groups of wordlines in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T)=dW/dV_T$, where dW represents the probability that any given cell has its threshold voltage within the interval $[V_T, V_T+dV_T]$ when charge Q is placed on the cell.

A memory device can exhibit threshold voltage distributions $P(Q, V_T)$ that are narrow compared with the working range of control voltages tolerated by the cells of the device. Accordingly, multiple non-overlapping distributions $P(Q_k,$ $V_T$) ("valleys") can be fit into the working range allowing for storage and reliable detection of multiple values of the charge $Q_k$, k=1, 2, 3 . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. As another example, in an MLC cell, there are 3 read windows that exist with respect to the 4 $V_t$ distributions. As yet another example, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows. RWB degradation can negatively affect memory device reliability. For example, RWB degradation can lead to an increase in the number of errors (e.g., bit errors) and/or error rate (e.g., bit error rate (BER)).

Some memory devices, such as three-dimensional (3D) cross-point devices, can include multiple portions. A portion, such as a deck or layer, can be defined as a two-dimensional (2D) array of memory cells electronically addressable by a vertical access line(s). Multiple decks can be stacked within a memory device (e.g., stacked vertically). Certain memory cells of certain wordlines of each deck can inherently have differing RWBs and thus differing memory device reliability than other memory cells of other wordlines. For example, in certain memory devices, the bottom wordlines of each deck are considered to be RWB-limiting wordlines, i.e., the bottom wordlines have limited margins between the read windows such that the cumulative value of the read windows is smaller, thus corresponding to smaller RWBs than other wordlines of each deck. The difference in RWB from deck to deck, wordline to wordline, and cell to cell can be due to variability in manufacturing processes, e.g., etching processes, etc.

Aspects of the present disclosure address the above and other deficiencies by implementing adaptive time sense parameters and overdrive voltage parameters for respective groups of wordlines in a memory sub-system. Implementing adaptive time sense parameters and overdrive voltage parameters for respective groups of wordlines can be used to selectively determine when to perform a memory access operation, using, for example, a longer time sense parameter and/or a higher overdrive voltage parameter. The adaptive process can use different time sense parameters and different overdrive voltage parameters for different groups of wordlines to take into account the sensitivity of certain wordlines of a particular deck to the effects that cause smaller RWBs and lower memory device reliability. For example, a memory access operation with a longer time sense and/or maximum overdrive voltage can be beneficial for a group of wordlines that are located on the bottom of a particular deck and thus are considered RWB-limiting wordlines. The memory access operation can be performed using adaptively applied time sense parameters and overdrive voltage parameters that are specific to that particular group of wordlines, thus only causing an increase in programming time or read time in the wordlines that have the lowest RWBs and minimally impacting the overall average programming time or read time among all wordlines of the memory device.

To implement adaptive time sense parameters and overdrive voltage parameters for respective groups of wordlines in a memory sub-system as described herein, a memory sub-system controller can receive a request to perform a memory access operation (e.g., a program verify operation and/or read operation) on a set of memory cells that are associated with a wordline of a memory device. The memory sub-system controller can determine that the wordline is disposed on a particular deck of the memory device (e.g., a top deck). In response to determining that the wordline is disposed on the first deck, the memory sub-system controller can determine that the wordline is associated with a first group of wordlines that is connected to the top deck. In some embodiments, the first group of wordlines can include one or more wordlines that are physically located at the bottom layer of the top deck. In response to determining that the wordline is associated with the first group of wordlines connected to the top deck, the memory sub-system controller can perform the memory access operation on the set of memory cells connected to the wordline using a time sense parameter and/or overdrive voltage parameter, where the time sense parameter and/or overdrive voltage parameter corresponds to (e.g., is unique to) the first group of wordlines connected to the top deck. The memory sub-system controller can retrieve the time sense parameter and/or overdrive voltage parameter using a configuration table stored on the memory device that associates respective groups of wordlines disposed on a respective deck with a specific time sense parameter and/or overdrive voltage parameter in entries of the table. In some embodiments, the memory sub-system controller can determine that the wordline is associated with another (e.g., second) group of wordlines that is connected to the top deck. For example, the second group of wordlines can include one or more wordlines that are physically located at another layer of the top deck, such as a top layer of the top deck. In response to determining that the wordline is associated with the second group of wordlines that is connected to the top deck, the memory sub-system controller can perform the memory access operation on the set of memory cells using another (e.g., second) time sense parameter and/or overdrive voltage parameter that corresponds to (e.g., is unique to) the second group of wordlines connected to the top deck. The memory sub-system controller can retrieve the second time sense parameter and/or overdrive voltage parameter from the configuration table stored on the memory device. In some embodiments, the memory sub-system controller can determine that the wordline is disposed on another (e.g., second) deck of the memory device (e.g., a bottom deck). In response to determining that the wordline is disposed on the bottom deck, the memory sub-system controller can determine that the wordline is associated with a first group of wordlines that is connected to the bottom deck. In response to determining that the wordline is associated with the first group of wordlines that is connected to the bottom deck, the memory sub-system controller can perform the memory access operation on the set of memory cells using a third time sense parameter and/or overdrive voltage parameter, where the third time sense parameter and/or overdrive voltage parameter corresponds to (e.g., is unique to) the first group of wordlines that is connected to the bottom deck. The memory sub-system controller can retrieve the third time sense parameter and/or overdrive voltage parameter from the configuration table stored on the memory device. In some embodiments, the memory sub-system controller can determine that the wordline is associated with another (e.g., second) group of wordlines that is connected to the bottom deck. In response to determining that the wordline is associated with the second group of wordlines that is connected to the bottom deck, the memory sub-system controller can perform the memory access operation on the set of memory cells using a fourth time sense parameter and/or overdrive voltage parameter, where the fourth time sense parameter and/or overdrive voltage parameter corresponds to (e.g., is unique to) the second group of wordlines that is connected to the bottom deck. The memory sub-system controller can retrieve the fourth time sense parameter and/or overdrive voltage parameter from the configuration table stored on the memory device. In some embodiments, the memory sub-system controller can determine that an adaptive configuration for the time sense parameter and/or overdrive voltage parameter is enabled or disabled. If the memory sub-system controller determines that the adaptive configuration is disabled, the memory sub-system controller performs the memory access operation on the set of memory cells using a default time sense parameter and/or overdrive voltage parameter. The memory sub-system controller can retrieve the default time sense parameter and/or overdrive voltage parameter from the configuration table stored on the memory device.

As opposed to the predetermined constant time sense parameter and/or overdrive voltage parameter utilized in certain memory devices when performing memory access operations, each time sense parameter and overdrive voltage parameter described herein can be determined adaptively. Thus, the adaptive time sense parameters and overdrive voltage parameters can result in improved program verify and read performance by having applying specific time sense parameters and overdrive voltage parameters to specific groups of wordlines, where longer time sense parameters and maximum overdrive voltage parameters can be applied only to groups of wordlines that are RWB-limiting wordlines. Further details regarding implementing adaptive time sense parameters and overdrive voltage parameters for respective groups of wordlines are described herein below with reference to FIGS. 2-6.

Advantages of the present disclosure include, but are not limited to, improved memory device performance and reliability. For example, implementing adaptive time sense parameters and overdrive voltage parameters for respective groups of wordlines can improve the average programming time and read time among wordlines of a memory device by adaptively applying longer time sense parameters and maximum overdrive voltage parameters only in cases of wordlines with low RWBs instead of all wordlines. Thus, the reliability of the wordlines with the lowest RWBs can be improved while only minimally impacting the average programming time and read time among all wordlines of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an adaptive parameter component 113 that can be used to implement the adaptive time sense parameters and overdrive voltage parameters for groups of wordlines in a memory sub-system, in accordance with embodiments of the present disclosure. In some embodiments, the memory sub-system controller 115 includes at least a portion of the adaptive parameter component 113. In some embodiments, the adaptive parameter component 113 is part of the host system 110, an application, or an operating system. In other embodiments, local media controller 135 includes at least a portion of adaptive parameter component 113 and is configured to perform the functionality described herein.

In some embodiments, the adaptive parameter component 113 can receive a request to perform a memory access operation (e.g., a program verify operation and/or read operation) on a set of memory cells that are associated with a wordline of a memory device. The adaptive parameter component 113 can determine that the wordline is disposed on a particular deck of the memory device (e.g., a top deck). In response to determining that the wordline is disposed on the first deck, the adaptive parameter component 113 can determine that the wordline is associated with a first group of wordlines that is connected to the top deck. In some embodiments, the first group of wordlines can include one or more wordlines that are physically located at the bottom layer of the top deck. In response to determining that the wordline is associated with the first group of wordlines connected to the top deck, the adaptive parameter component 113 can perform the memory access operation on the set of memory cells connected to the wordline using a time sense parameter and/or overdrive voltage parameter, where the time sense parameter and/or overdrive voltage parameter corresponds to (e.g., is unique to) the first group of wordlines connected to the top deck. The adaptive parameter component 113 can retrieve the time sense parameter and/or overdrive voltage parameter using a configuration table stored on the memory device that associates respective groups of wordlines disposed on a respective deck with a specific time sense parameter and/or overdrive voltage parameter in entries of the table. In some embodiments, the adaptive parameter component 113 can determine that the wordline is associated with another (e.g., second) group of wordlines that is connected to the top deck. For example, the second group of wordlines can include one or more wordlines that are physically located at another layer of the top deck, such as a top layer of the top deck. In response to determining that the wordline is associated with the second group of wordlines that is connected to the top deck, the adaptive parameter component 113 can perform the memory access operation on the set of memory cells using another (e.g., second) time sense parameter and/or overdrive voltage parameter that corresponds to (e.g., is unique to) the second group of wordlines connected to the top deck. The adaptive parameter component 113 can retrieve the second time sense parameter and/or overdrive voltage parameter from the configuration table stored on the memory device. In some embodiments, the adaptive parameter component 113 can determine that the wordline is disposed on another (e.g., second) deck of the memory device (e.g., a bottom deck). In response to determining that the wordline is disposed on the bottom deck, the adaptive parameter component 113 can determine that the wordline is associated with a first group of wordlines that is connected to the bottom deck. In response to determining that the wordline is associated with the first group of wordlines that is connected to the bottom deck, the adaptive parameter component 113 can perform the memory access operation on the set of memory cells using a third time sense parameter and/or overdrive voltage parameter, where the third time sense parameter and/or overdrive voltage parameter corresponds to (e.g., is unique to) the first group of wordlines that is connected to the bottom deck. The adaptive parameter component 113 can retrieve the third time sense parameter and/or overdrive voltage parameter from the configuration table stored on the memory device. In some embodiments, the adaptive parameter component 113 can determine that the wordline is associated with another (e.g., second) group of wordlines that is connected to the bottom deck. In response to determining that the wordline is associated with the second group of wordlines that is connected to the bottom deck, the adaptive parameter component 113 can perform the memory access operation on the set of memory cells using a fourth time sense parameter and/or overdrive voltage parameter, where the fourth time sense parameter and/or overdrive voltage parameter corresponds to (e.g., is unique to) the second group of wordlines that is connected to the bottom deck. The adaptive parameter component 113 can retrieve the fourth time sense parameter and/or overdrive voltage parameter from the configuration table stored on the memory device. In some embodiments, the adaptive parameter component 113 can determine that an adaptive configuration for the time sense parameter and/or overdrive voltage parameter is enabled or disabled. If the adaptive parameter component 113 determines that the adaptive configuration is disabled, the adaptive parameter component 113 performs the memory access operation on the set of memory cells using a default time sense parameter and/or overdrive voltage parameter. The adaptive parameter component 113 can retrieve the default time sense parameter and/or overdrive voltage parameter from the configuration table stored on the memory device. Further details regarding the operations of the adaptive parameter component 113 will be described below with reference to FIGS. 3-6.

It will be appreciated by those skilled in the art that additional circuitry and signals can be provided, and that the components of FIG. 1 have been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

FIG. 2 is a diagram of an example configuration table, in accordance with some embodiments of the present disclosure. As illustrated in FIG. 2, a configuration table can be stored in a memory device (e.g., the memory device 130 of FIG. 1) and can be used in implementing adaptive time sense parameters and overdrive voltage parameters for groups of wordlines in a memory sub-system (e.g., the memory sub-system 110 of FIG. 1). In some embodiments, the configuration table can be any data structure that can store information. The configuration table can include an entry for a category 201 of adaptive parameters, such as adaptive time sense parameter 201a and adaptive overdrive voltage parameter 201b. Each category can have one or more corresponding parameters 203 and notes 205 (e.g., annotations, comments, other relevant data, etc.) associated with it.

In some embodiments, the adaptive time sense parameter category can have at least one or more parameters (e.g., 203a, 203b, 203c, 203d, 203e, 203f, 203g, 203h) associated with it, where each of the parameters are in an entry associated with the adaptive time sense parameter category. In some embodiments, the adaptive time sense parameter category can have notes associated with each parameter, where each of the notes are in an entry associated with each parameter. In some embodiments, the notes can include a description (e.g., textual description) of each parameter. In some embodiments, the adaptive time sense parameter category can have a set of one or more parameters (e.g., 203a, 203b, 203c, 203d) that are associated with a particular deck (e.g., the top deck and/or deck 1). In some embodiments, the adaptive time sense parameter category can have another set of one or more parameters (e.g., 203e, 203f, 203g, 203h) that are associated with another deck (e.g., the bottom deck and/or deck 2). These parameters can be used for determining whether an adaptive configuration for time sense parameters is enabled or not, whether a wordline is located in a particular group of wordlines and/or particular deck of the memory device, default time sense parameters, specific time sense parameters to apply to particular groups of wordlines of a particular deck, etc.

In some embodiments, the adaptive overdrive voltage parameter category can have at least one or more parameters (e.g., 203aa, 203bb, 203cc, 203dd, 203ee, 203ff) associated with it, where each of the parameters are in an entry associated with the adaptive overdrive voltage parameter category. In some embodiments, the adaptive overdrive voltage parameter category can have notes associated with each parameter, where each of the notes are in an entry associated with each parameter. In some embodiments, the notes can include a description (e.g., textual description) of each parameter. In some embodiments, the adaptive overdrive voltage parameter category can have a set of one or more parameters (e.g., 203aa, 203bb, 203cc) that are associated with a particular deck (e.g., the top deck and/or deck 1). In some embodiments, the adaptive overdrive voltage parameter category can have another set of one or more parameters (e.g., 203dd, 203ee, 203ff) that are associated with another deck (e.g., the bottom deck and/or deck 2). These parameters can be used for determining whether an adaptive configuration for overdrive voltage parameters is enabled or not, whether a wordline is located in a particular group of wordlines and/or particular deck of the memory device, default overdrive voltage parameters, specific overdrive voltage parameters to apply to particular groups of wordlines of a particular deck, etc. The illustrated embodiments should be understood only as examples. FIG. 2 will be described in more detail with respect to FIGS. 3-6 herein.

Figure 3:
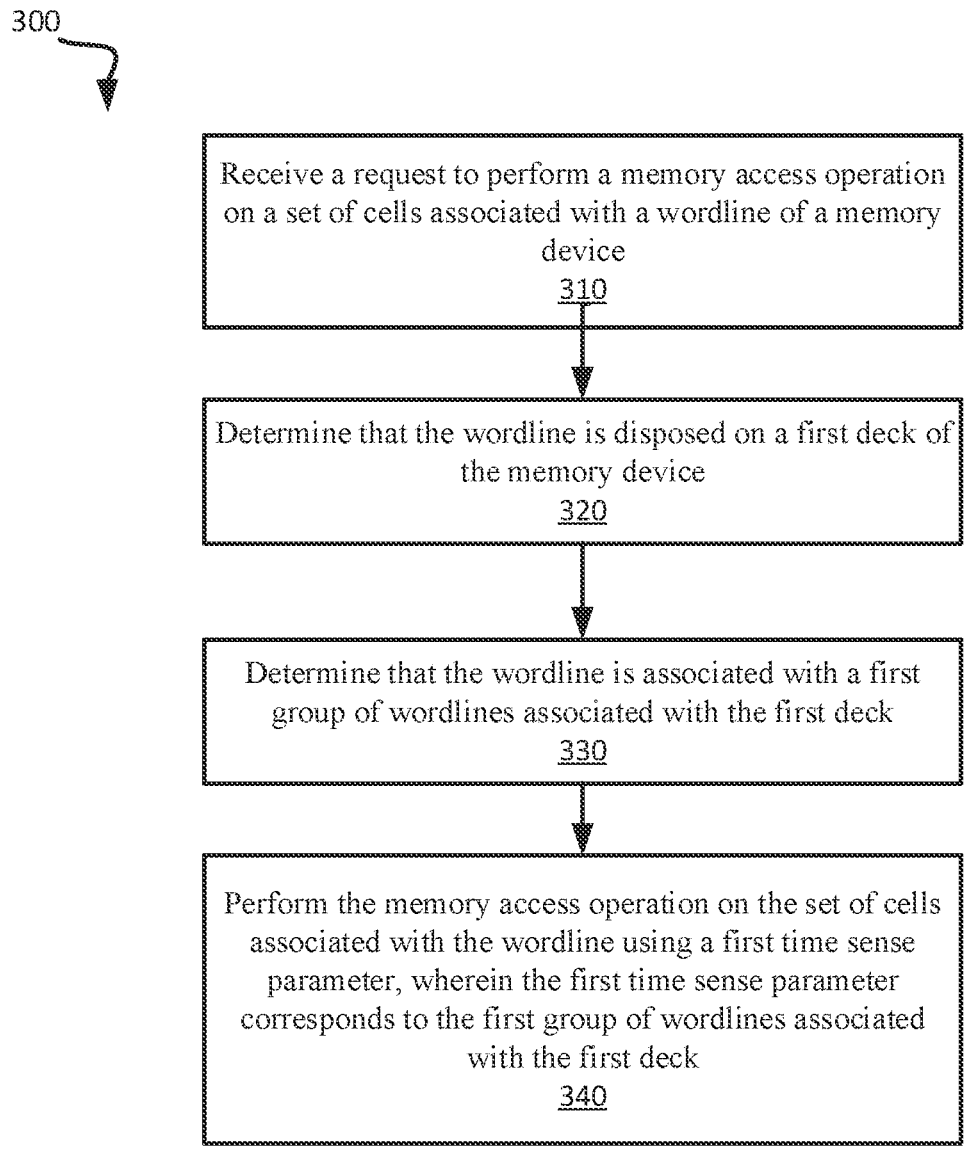
FIG. 3 is a flow diagram illustrating an example of a method to implement adaptive time sense parameters for respective groups of wordlines, in accordance with some embodiments of the present disclosure.

FIG. 3 is a flow diagram of an example method 300 to implement adaptive time sense parameters for respective groups of wordlines, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the adaptive parameter component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic receives a request to perform a memory access operation (e.g., a program verify operation and/or read operation) on a set of memory cells that are associated with a wordline of a memory device, such as memory device 130 of FIG. 1. In some embodiments, the memory access operation can be received at a memory sub-system controller (e.g., the memory sub-system controller 115 of FIG. 1) from a host device (e.g., the host system 120 of FIG. 1).

At operation 320, the processing logic determines that the wordline is disposed on a particular (e.g., first) deck of the memory device (e.g., a top deck or a bottom deck). In some embodiments, determining that the wordline is disposed on the first deck of the memory device can be based on identifying a physical and/or logical address of the wordline. For example, the processing logic can identify that the logical address of the wordline is $WL_3$. The processing logic can use a data structure, such as a mapping table, to identify a deck to which the wordline is mapped based on the address of the wordline. The data structure can list each wordline of the memory device in an entry and can list a corresponding deck of the memory device on which the wordline is disposed in an associated (e.g., linked) entry. In some embodiments, the data structure can be preconfigured at manufacturing of the memory device. In some embodiments, the data structure can be stored on the memory device. In some embodiments, the data structure can be the configuration table illustrated in FIG. 2.

At operation 330, the processing logic determines that the wordline is associated with a particular (e.g., first) group of wordlines connected to the first deck. In some embodiments, the first group of wordlines can include one or more wordlines that are physically located at the bottom layer of the first deck. In some embodiments, the processing logic determines that the wordline is associated with the first group of wordlines connected to the first deck in response to determining that the wordline is disposed on the first deck of the memory device. In some embodiments, determining that the wordline is associated with the first group of wordlines can include looking up the wordline (e.g., using the logical and/or physical address of the wordline and/or a reference number associated with the wordline) in a data structure.

The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 340, the processing logic performs the memory access operation on the set of memory cells associated with the wordline. In some embodiments, the processing logic performs the memory access operation on the set of memory cells associated with the wordline in response to determining that the wordline is associated with the first group of wordlines. In some embodiments, the processing logic performs the memory access operation using a particular (e.g., first) time sense parameter. The first time sense parameter can correspond to (e.g., is unique to) the first group of wordlines connected to the first deck. For example, the first time sense parameter can be assigned to the particular group of wordlines due to certain physical characteristics of the wordlines, e.g., the wordlines are the bottom wordlines of the particular deck and/or the wordlines are RWB-limiting wordlines. The memory sub-system controller can retrieve the time sense parameter using a data structure (e.g., the configuration table illustrated in FIG. 2) stored on the memory device that lists a respective group of wordlines disposed on a respective deck in an entry and lists a specific time sense parameter in associated (e.g., linked) entries of the table. The configuration table can be predetermined at manufacturing of the memory device based on offline testing and media characterization of the memory device under various testing conditions.

Figure 4:
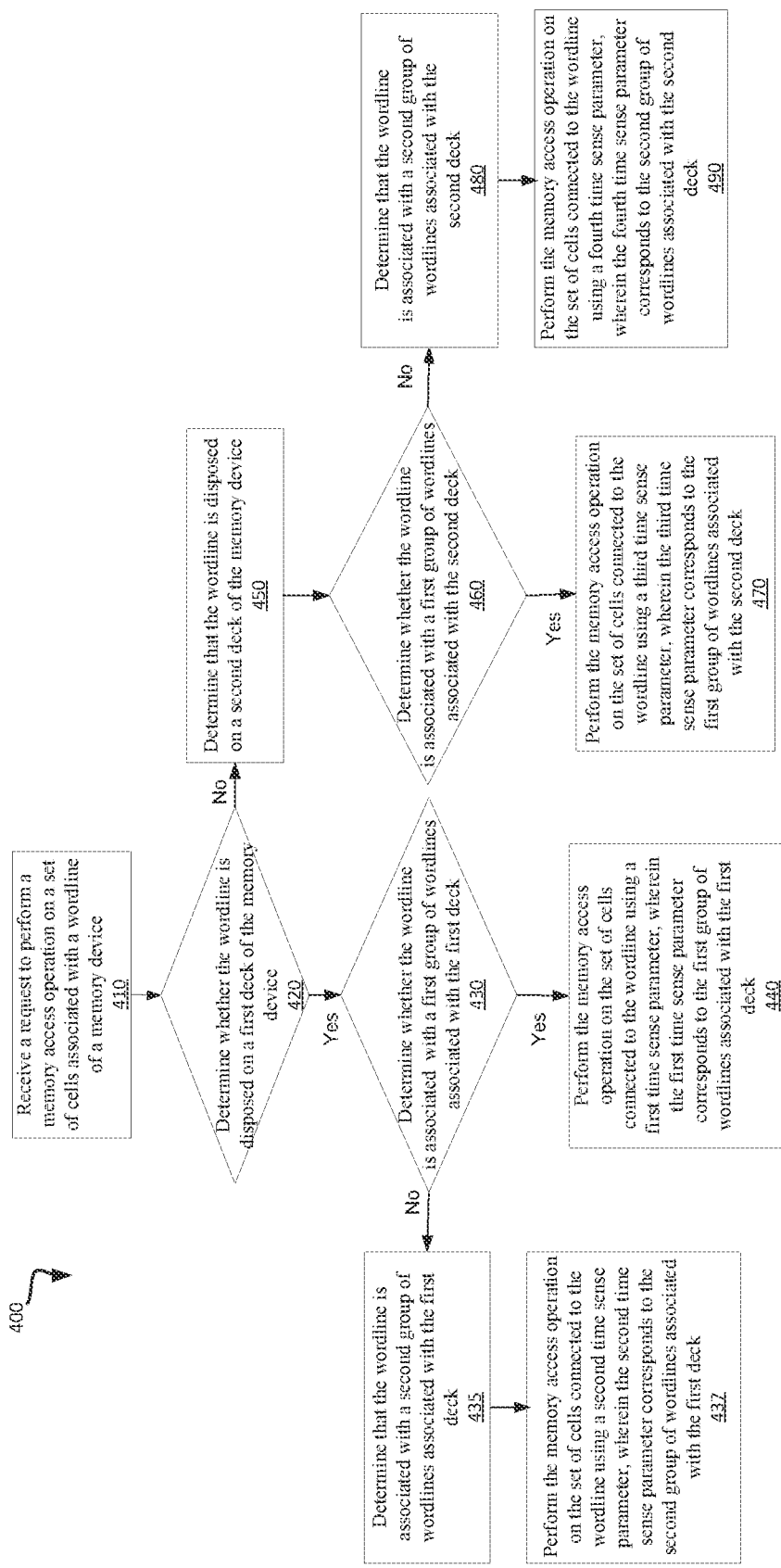
FIG. 4 is a flow diagram illustrating an example of a method to implement adaptive time sense parameters for respective groups of wordlines, in accordance with some embodiments of the present disclosure.

FIG. 4 is a flow diagram of an example method 400 to implement adaptive time sense parameters for respective groups of wordlines, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the adaptive parameter component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a request to perform a memory access operation (e.g., a program verify operation and/or read operation) on a set of memory cells that are associated with a wordline of a memory device, such as memory device 130 of FIG. 1. In some embodiments, the memory access operation can be received at a memory sub-system controller (e.g., the memory sub-system controller 115 of FIG. 1) from a host device (e.g., the host system 120 of FIG. 1).

At operation 420, the processing logic determines that the wordline is disposed on a particular (e.g., first) deck of the memory device (e.g., a top deck or a bottom deck). In some embodiments, determining that the wordline is disposed on the first deck of the memory device can be based on identifying a physical and/or logical address of the wordline. For example, the processing logic can identify that the logical address of the wordline is $WL_3$. The processing logic can use a data structure, such as a mapping table, to identify a deck to which the wordline is mapped based on the address of the wordline. The data structure can list each wordline of the memory device in an entry and can list a corresponding deck of the memory device on which the wordline is disposed in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 430, the processing logic determines that the wordline is associated with a particular (e.g., first) group of wordlines connected to the first deck. In some embodiments, the first group of wordlines can include one or more wordlines that are physically located at the bottom layer of the first deck. In some embodiments, the processing logic determines that the wordline is associated with the first group of wordlines connected to the first deck in response to determining that the wordline is disposed on the first deck of the memory device. In some embodiments, determining that the wordline is associated with the first group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 440, the processing logic performs the memory access operation on the set of memory cells associated with the wordline. In some embodiments, the processing logic performs the memory access operation on the set of memory cells associated with the wordline in response to determining that the wordline is associated with the first group of wordlines. In some embodiments, the processing logic performs the memory access operation using a particular (e.g., first) time sense parameter. The first time sense parameter can correspond to (e.g., is unique to) the first group of wordlines connected to the first deck. For example, the first time sense parameter can be assigned to the particular group of wordlines due to certain physical characteristics of the wordlines, e.g., the wordlines are the bottom wordlines of the particular deck and/or the wordlines are RWB-limiting wordlines. The memory sub-system controller can retrieve the first time sense parameter using a data structure (e.g., the configuration table illustrated in FIG. 2) stored on the memory device that lists a respective group of wordlines disposed on a respective deck in an entry and lists a specific time sense parameter in associated (e.g., linked) entries of the table. The configuration table can be predetermined at manufacturing of the memory device based on offline testing and media characterization of the memory device under various testing conditions.

At operation 435, in response to determining that the wordline is not associated with the first group of wordlines connected to the first deck at operation 430, the processing logic determines that the wordline is associated with another (e.g., second) group of wordlines associated with the first deck. For example, the second group of wordlines can include one or more wordlines that are physically located at another layer of the first deck, such as a top layer of the first deck. In some embodiments, determining that the wordline is associated with the second group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 437, the processing logic performs the memory access operation on the set of memory cells associated with the wordline. In some embodiments, the processing logic performs the memory access operation on the set of memory cells associated with the wordline in response to determining that the wordline is associated with the second group of wordlines associated with the top deck. In some embodiments, the processing logic performs the memory access operation using another (e.g., second) time sense parameter. The second time sense parameter can correspond to (e.g., is unique to) the second group of wordlines connected to the first deck. For example, the second time sense parameter can be assigned to the second group of wordlines due to certain physical characteristics of the wordlines, e.g., the wordlines are the top wordlines of the first deck and/or the wordlines are not RWB-limiting wordlines. The memory sub-system controller can retrieve the second time sense parameter using a data structure (e.g., the configuration table illustrated in FIG. 2) stored on the memory device that lists a respective group of wordlines disposed on a respective deck in an entry and lists a specific time sense parameter in associated (e.g., linked) entries of the table. The configuration table can be predetermined at manufacturing of the memory device based on offline testing and media characterization of the memory device under various testing conditions.

At operation 450, in response to determining that the wordline is not disposed on the first deck of the memory device, the processing logic determines that the wordline is disposed on another (e.g., second) deck of the memory device (e.g., a top deck or a bottom deck). In some embodiments, determining that the wordline is disposed on the second deck of the memory device can be based on identifying a physical and/or logical address of the wordline. For example, the processing logic can identify that the logical address of the wordline is $WL_{16}$. The processing logic can use a data structure, such as a mapping table, to identify a deck to which the wordline is mapped based on the address of the wordline. The data structure can list each wordline of the memory device in an entry and can list a corresponding deck of the memory device on which the wordline is disposed in an associated (e.g., linked) entry. In some embodiments, the data structure can be preconfigured at manufacturing of the memory device. In some embodiments, the data structure can be stored on the memory device. In some embodiments, the data structure can be the configuration table illustrated in FIG. 2.

At operation 460, the processing logic determines that the wordline is associated with a particular (e.g., first) group of wordlines connected to the second deck. In some embodiments, the first group of wordlines can include one or more wordlines that are physically located at the bottom layer of the second deck. In some embodiments, the processing logic determines that the wordline is associated with the first group of wordlines connected to the second deck in response to determining that the wordline is disposed on the second deck of the memory device. In some embodiments, determining that the wordline is associated with the first group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 470, the processing logic performs the memory access operation on the set of memory cells associated with the wordline. In some embodiments, the processing logic performs the memory access operation on the set of memory cells associated with the wordline in response to determining that the wordline is associated with the first group of wordlines. In some embodiments, the processing logic performs the memory access operation using a particular (e.g., third) time sense parameter. The third time sense parameter can correspond to (e.g., is unique to) the first group of wordlines connected to the second deck. For example, the third time sense parameter can be assigned to the particular group of wordlines due to certain physical characteristics of the wordlines, e.g., the wordlines are the bottom wordlines of the second deck and/or the wordlines are RWB-limiting wordlines. The memory sub-system controller can retrieve the third time sense parameter using a data structure (e.g., the configuration table illustrated in FIG. 2) stored on the memory device that lists a respective group of wordlines disposed on a respective deck in an entry and lists a specific time sense parameter in associated (e.g., linked) entries of the table. The configuration table can be predetermined at manufacturing of the memory device based on offline testing and media characterization of the memory device under various testing conditions.

At operation 480, in response to determining that the wordline is not associated with the first group of wordlines connected to the second deck at operation 460, the processing logic determines that the wordline is associated with another (e.g., second) group of wordlines associated with the second deck. For example, the second group of wordlines can include one or more wordlines that are physically located at another layer of the second deck, such as a top layer of the second deck. In some embodiments, determining that the wordline is associated with the second group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 490, the processing logic performs the memory access operation on the set of memory cells associated with the wordline. In some embodiments, the processing logic performs the memory access operation on the set of memory cells associated with the wordline in response to determining that the wordline is associated with the second group of wordlines. In some embodiments, the processing logic performs the memory access operation using a particular (e.g., fourth) time sense parameter. The fourth time sense parameter can correspond to (e.g., is unique to) the second group of wordlines connected to the second deck. For example, the fourth time sense parameter can be assigned to the second group of wordlines due to certain physical characteristics of the wordlines, e.g., the wordlines are the top wordlines of the second deck and/or the wordlines are not RWB-limiting wordlines. The memory sub-system controller can retrieve the fourth time sense parameter using a data structure (e.g., the configuration table illustrated in FIG. 2) stored on the memory device that lists a respective group of wordlines disposed on a respective deck in an entry and lists a specific time sense parameter in associated (e.g., linked) entries of the table. The configuration table can be predetermined at manufacturing of the memory device based on offline testing and media characterization of the memory device under various testing conditions.

Figure 5:
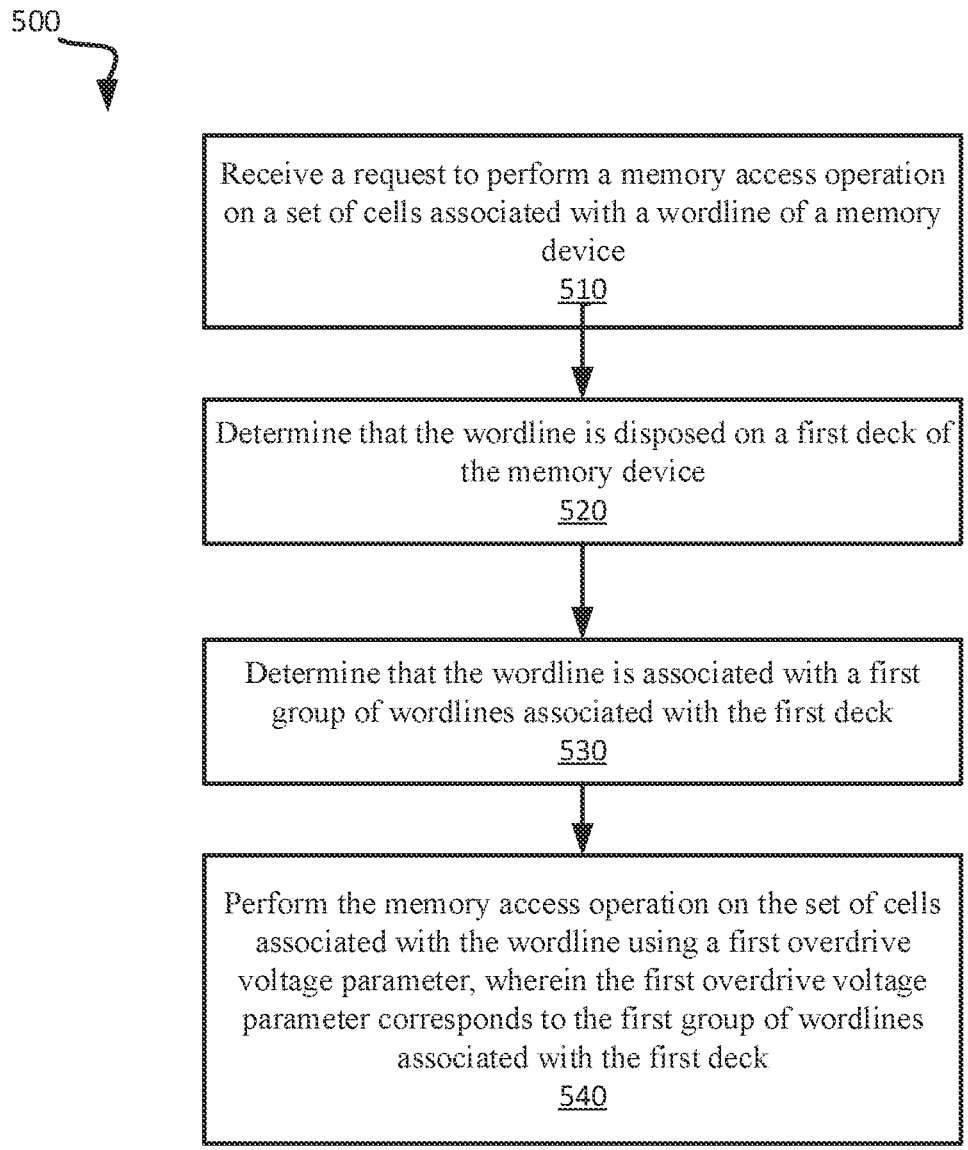
FIG. 5 is a flow diagram illustrating an example of a method to implement adaptive overdrive voltage parameters for respective groups of wordlines, in accordance with some embodiments of the present disclosure.

FIG. 5 is a flow diagram of an example method 500 to implement adaptive overdrive voltage parameters for respective groups of wordlines, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the adaptive parameter component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to perform a memory access operation (e.g., a program verify operation and/or read operation) on a set of memory cells that are associated with a wordline of a memory device, such as memory device 130 of FIG. 1. In some embodiments, the memory access operation can be received at a memory sub-system controller (e.g., the memory sub-system controller 115 of FIG. 1) from a host device (e.g., the host system 120 of FIG. 1).

At operation 520, the processing logic determines that the wordline is disposed on a particular (e.g., first) deck of the memory device (e.g., a top deck or a bottom deck). In some embodiments, determining that the wordline is disposed on the first deck of the memory device can be based on identifying a physical and/or logical address of the wordline. For example, the processing logic can identify that the logical address of the wordline is $WL_3$. The processing logic can use a data structure, such as a mapping table, to identify a deck to which the wordline is mapped based on the address of the wordline. The data structure can list each wordline of the memory device in an entry and can list a corresponding deck of the memory device on which the wordline is disposed in an associated (e.g., linked) entry. In some embodiments, the data structure can be preconfigured at manufacturing of the memory device. In some embodiments, the data structure can be stored on the memory device. In some embodiments, the data structure can be the configuration table illustrated in FIG. 2.

At operation 530, the processing logic determines that the wordline is associated with a particular (e.g., first) group of wordlines connected to the first deck. In some embodiments, the first group of wordlines can include one or more wordlines that are physically located at the bottom layer of the first deck. In some embodiments, the processing logic determines that the wordline is associated with the first group of wordlines connected to the first deck in response to determining that the wordline is disposed on the first deck of the memory device. In some embodiments, determining that the wordline is associated with the first group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 540, the processing logic performs the memory access operation on the set of memory cells associated with the wordline. In some embodiments, the processing logic performs the memory access operation on the set of memory cells associated with the wordline in response to determining that the wordline is associated with the first group of wordlines. In some embodiments, the processing logic performs the memory access operation using a particular (e.g., first) overdrive voltage parameter. The first overdrive voltage parameter can correspond to (e.g., is unique to) the first group of wordlines connected to the first deck. For example, the first overdrive voltage parameter can be assigned to the particular group of wordlines due to certain physical characteristics of the wordlines, e.g., the wordlines are the bottom wordlines of the particular deck and/or the wordlines are RWB-limiting wordlines. The memory sub-system controller can retrieve the first overdrive voltage parameter using a data structure (e.g., the configuration table illustrated in FIG. 2) stored on the memory device that lists a respective group of wordlines disposed on a respective deck in an entry and lists a specific overdrive voltage parameter in associated (e.g., linked) entries of the table. The configuration table can be predetermined at manufacturing of the memory device based on offline testing and media characterization of the memory device under various testing conditions.

Figure 6:
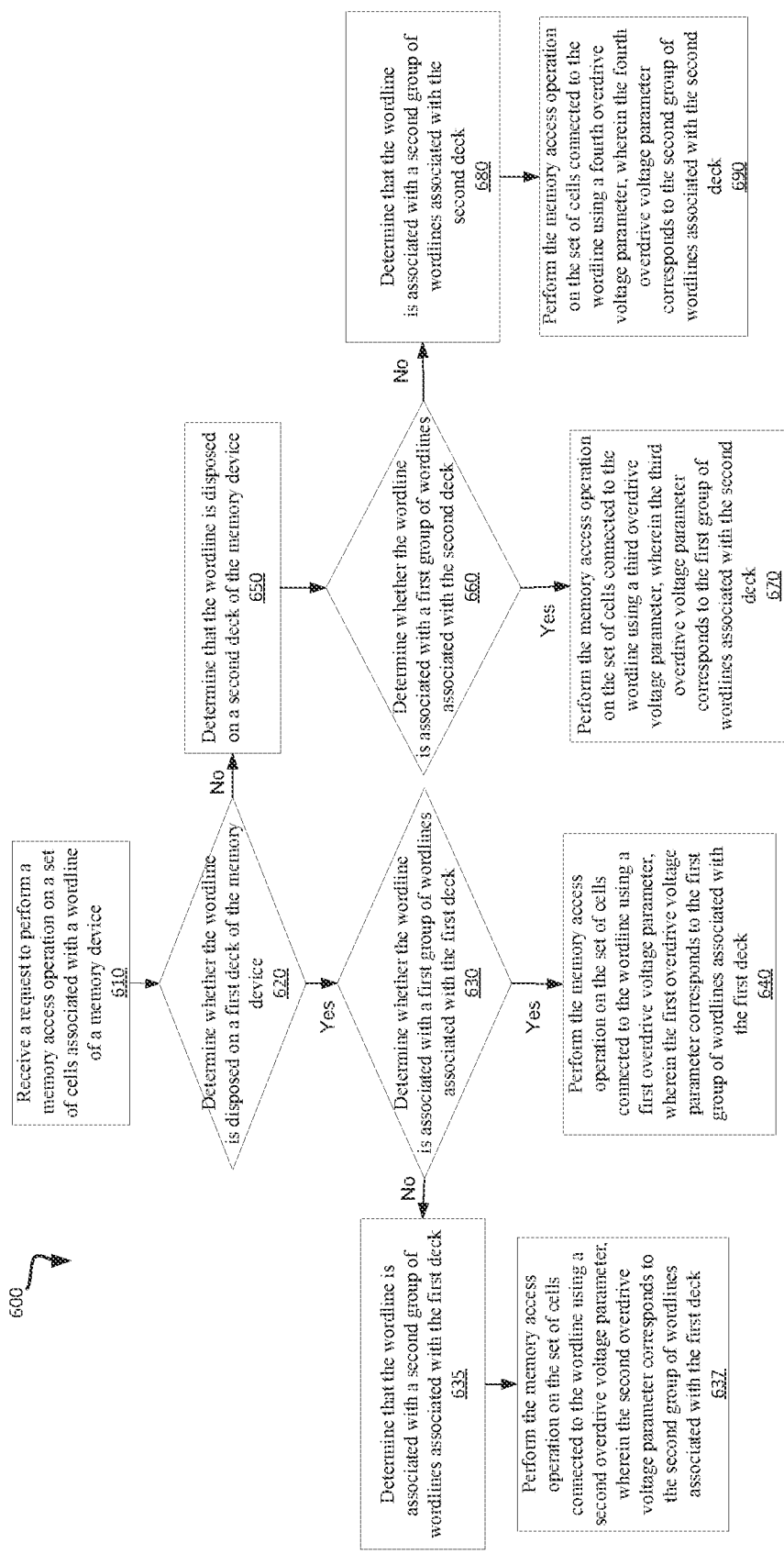
FIG. 6 is a flow diagram illustrating an example of a method to implement adaptive overdrive voltage parameters for respective groups of wordlines, in accordance with some embodiments of the present disclosure.

FIG. 6 is a flow diagram of an example method 600 to implement adaptive overdrive voltage parameters for respective groups of wordlines, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the adaptive parameter component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a request to perform a memory access operation (e.g., a program verify operation and/or read operation) on a set of memory cells that are associated with a wordline of a memory device, such as memory device 130 of FIG. 1. In some embodiments, the memory access operation can be received at a memory sub-system controller (e.g., the memory sub-system controller 115 of FIG. 1) from a host device (e.g., the host system 120 of FIG. 1).

At operation 620, the processing logic determines that the wordline is disposed on a particular (e.g., first) deck of the memory device (e.g., a top deck or a bottom deck). In some embodiments, determining that the wordline is disposed on the first deck of the memory device can be based on identifying a physical and/or logical address of the wordline. For example, the processing logic can identify that the logical address of the wordline is $WL_3$. The processing logic can use a data structure, such as a mapping table, to identify a deck to which the wordline is mapped based on the address of the wordline. The data structure can list each wordline of the memory device in an entry and can list a corresponding deck of the memory device on which the wordline is disposed in an associated (e.g., linked) entry. In some embodiments, the data structure can be preconfigured at manufacturing of the memory device. In some embodiments, the data structure can be stored on the memory device. In some embodiments, the data structure can be the configuration table illustrated in FIG. 2.

At operation 630, the processing logic determines that the wordline is associated with a particular (e.g., first) group of wordlines connected to the first deck. In some embodiments, the first group of wordlines can include one or more wordlines that are physically located at the bottom layer of the first deck. In some embodiments, the processing logic determines that the wordline is associated with the first group of wordlines connected to the first deck in response to determining that the wordline is disposed on the first deck of the memory device. In some embodiments, determining that the wordline is associated with the first group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 640, the processing logic performs the memory access operation on the set of memory cells associated with the wordline. In some embodiments, the processing logic performs the memory access operation on the set of memory cells associated with the wordline in response to determining that the wordline is associated with the first group of wordlines. In some embodiments, the processing logic performs the memory access operation using a particular (e.g., first) overdrive voltage parameter. The first overdrive voltage parameter can correspond to (e.g., is unique to) the first group of wordlines connected to the first deck. For example, the first overdrive voltage parameter can be assigned to the particular group of wordlines due to certain physical characteristics of the wordlines, e.g., the wordlines are the bottom wordlines of the particular deck and/or the wordlines are RWB-limiting wordlines. The memory sub-system controller can retrieve the first overdrive voltage parameter using a data structure (e.g., the configuration table illustrated in FIG. 2) stored on the memory device that lists a respective group of wordlines disposed on a respective deck in an entry and lists a specific overdrive voltage parameter in associated (e.g., linked) entries of the table. The configuration table can be predetermined at manufacturing of the memory device based on offline testing and media characterization of the memory device under various testing conditions.

At operation 635, in response to determining that the wordline is not associated with the first group of wordlines connected to the first deck at operation 630, the processing logic determines that the wordline is associated with another (e.g., second) group of wordlines associated with the first deck. For example, the second group of wordlines can include one or more wordlines that are physically located at another layer of the first deck, such as a top layer of the first deck. In some embodiments, determining that the wordline is associated with the second group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 637, the processing logic performs the memory access operation on the set of memory cells associated with the wordline. In some embodiments, the processing logic performs the memory access operation on the set of memory cells associated with the wordline in response to determining that the wordline is associated with the second group of wordlines associated with the top deck. In some embodiments, the processing logic performs the memory access operation using another (e.g., second) overdrive voltage parameter. The second overdrive voltage parameter can correspond to (e.g., is unique to) the second group of wordlines connected to the first deck. For example, the second overdrive voltage parameter can be assigned to the second group of wordlines due to certain physical characteristics of the wordlines, e.g., the wordlines are the top wordlines of the first deck and/or the wordlines are not RWB-limiting wordlines. The memory sub-system controller can retrieve the second overdrive voltage parameter using a data structure (e.g., the configuration table illustrated in FIG. 2) stored on the memory device that lists a respective group of wordlines disposed on a respective deck in an entry and lists a specific overdrive voltage parameter in associated (e.g., linked) entries of the table. The configuration table can be predetermined at manufacturing of the memory device based on offline testing and media characterization of the memory device under various testing conditions.

At operation 650, in response to determining that the wordline is not disposed on the first deck of the memory device, the processing logic determines that the wordline is disposed on another (e.g., second) deck of the memory device (e.g., a top deck or a bottom deck). In some embodiments, determining that the wordline is disposed on the second deck of the memory device can be based on identifying a physical and/or logical address of the wordline. For example, the processing logic can identify that the logical address of the wordline is $WL_{16}$. The processing logic can use a data structure, such as a mapping table, to identify a deck to which the wordline is mapped based on the address of the wordline. The data structure can list each wordline of the memory device in an entry and can list a corresponding deck of the memory device on which the wordline is disposed in an associated (e.g., linked) entry. In some embodiments, the data structure can be preconfigured at manufacturing of the memory device. In some embodiments, the data structure can be stored on the memory device. In some embodiments, the data structure can be the configuration table illustrated in FIG. 2.

At operation 660, the processing logic determines that the wordline is associated with a particular (e.g., first) group of wordlines connected to the second deck. In some embodiments, the first group of wordlines can include one or more wordlines that are physically located at the bottom layer of the second deck. In some embodiments, the processing logic determines that the wordline is associated with the first group of wordlines connected to the second deck in response to determining that the wordline is disposed on the second deck of the memory device. In some embodiments, determining that the wordline is associated with the first group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 670, the processing logic performs the memory access operation on the set of memory cells associated with the wordline. In some embodiments, the processing logic performs the memory access operation on the set of memory cells associated with the wordline in response to determining that the wordline is associated with the first group of wordlines. In some embodiments, the processing logic performs the memory access operation using a particular (e.g., third) overdrive voltage parameter. The third overdrive voltage parameter can correspond to (e.g., is unique to) the first group of wordlines connected to the second deck. For example, the third overdrive voltage parameter can be assigned to the particular group of wordlines due to certain physical characteristics of the wordlines, e.g., the wordlines are the bottom wordlines of the second deck and/or the wordlines are RWB-limiting wordlines. The memory sub-system controller can retrieve the third overdrive voltage parameter using a data structure (e.g., the configuration table illustrated in FIG. 2) stored on the memory device that lists a respective group of wordlines disposed on a respective deck in an entry and lists a specific overdrive voltage parameter in associated (e.g., linked) entries of the table. The configuration table can be predetermined at manufacturing of the memory device based on offline testing and media characterization of the memory device under various testing conditions.

At operation 680, in response to determining that the wordline is not associated with the first group of wordlines connected to the second deck at operation 660, the processing logic determines that the wordline is associated with another (e.g., second) group of wordlines associated with the second deck. For example, the second group of wordlines can include one or more wordlines that are physically located at another layer of the second deck, such as a top layer of the second deck. In some embodiments, determining that the wordline is associated with the second group of wordlines can include looking up the wordline (e.g., using the logical and/or physical address of the wordline and/or a reference number associated with the wordline) in a data structure. The data structure can list each wordline of the memory device in an entry and can list a corresponding group of wordlines (e.g., a reference number associated with each group of wordlines) in an associated (e.g., linked) entry. In some embodiments, the data structure can be preconfigured at manufacturing of the memory device. In some embodiments, the data structure can be stored on the memory device. In some embodiments, the data structure can be configuration table illustrated in FIG. 2.

At operation 690, the processing logic performs the memory access operation on the set of memory cells associated with the wordline. In some embodiments, the processing logic performs the memory access operation on the set of memory cells associated with the wordline in response to determining that the wordline is associated with the second group of wordlines. In some embodiments, the processing logic performs the memory access operation using a particular (e.g., fourth) overdrive voltage parameter. The fourth overdrive voltage parameter can correspond to (e.g., is unique to) the second group of wordlines connected to the second deck. For example, the fourth overdrive voltage parameter can be assigned to the second group of wordlines due to certain physical characteristics of the wordlines, e.g., the wordlines are the top wordlines of the second deck and/or the wordlines are not RWB-limiting wordlines. The memory sub-system controller can retrieve the fourth overdrive voltage parameter using a data structure (e.g., the configuration table illustrated in FIG. 2) stored on the memory device that lists a respective group of wordlines disposed on a respective deck in an entry and lists a specific overdrive voltage parameter in associated (e.g., linked) entries of the table. The configuration table can be predetermined at manufacturing of the memory device based on offline testing and media characterization of the memory device under various testing conditions.

Figure 7:
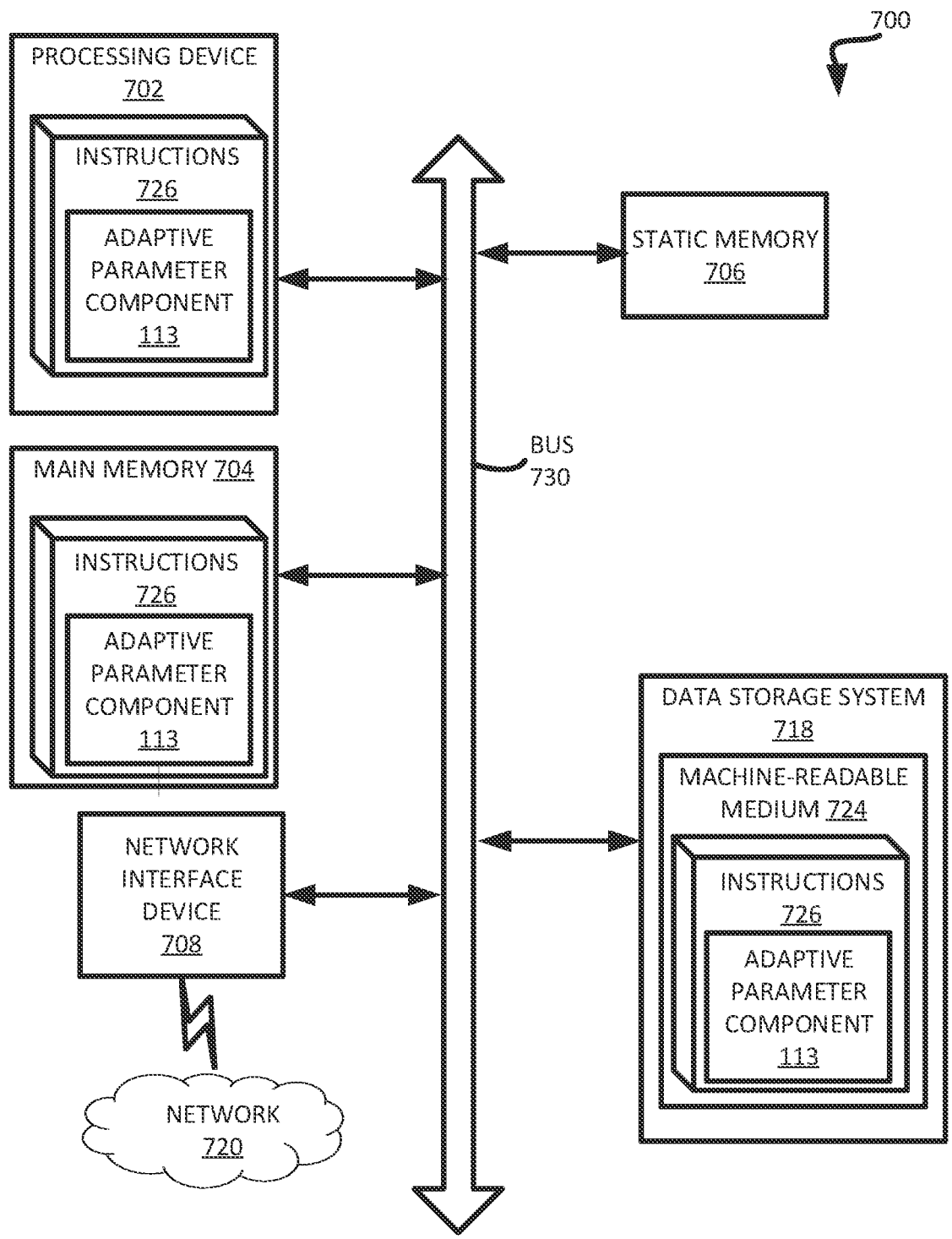
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the adaptive parameter component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a component (e.g., adaptive parameter component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
receiving a request to perform a memory access operation on a set of cells associated with a wordline of the memory device;
determining that the wordline is disposed on a first deck of the memory device;
responsive to determining that the wordline is disposed on the first deck, determining that the wordline is associated with a first group of wordlines associated with the first deck;
identifying a first time sense parameter assigned to the first group of wordlines associated with the first deck, wherein the first time sense parameter is assigned to the first group of wordlines based on a read window budget (RWB) associated with the first group of wordlines; and
performing the memory access operation on the set of cells associated with the wordline using the first time sense parameter.

2. The system of claim 1, wherein the processing device is to perform operations further comprising:
determining that the wordline is associated with a second group of wordlines associated with the first deck; and
responsive to determining that the wordline is associated with the second group of wordlines associated with the first deck, performing the memory access operation on the set of cells associated with the wordline using a second time sense parameter, wherein the second time sense parameter corresponds to the second group of wordlines associated with the first deck.

3. The system of claim 1, wherein the processing device is to perform operations further comprising:
determining that the wordline is disposed on a second deck of the memory device;
responsive to determining that the wordline is disposed on the second deck, determining that the wordline is associated with a first group of wordlines associated with the second deck; and
responsive to determining that the wordline is associated with the first group of wordlines associated with the second deck, performing the memory access operation on the set of cells associated with the wordline using a third time sense parameter, wherein the third time sense parameter corresponds to the first group of wordlines associated with the second deck.

4. The system of claim 3, wherein the processing device is to perform operations further comprising:
determining that the wordline is associated with a second group of wordlines associated with the second deck; and
responsive to determining that the wordline is associated with the second group of wordlines associated with the second deck, performing the memory access operation on the set of cells associated with the wordline using a fourth time sense parameter, wherein the fourth time sense parameter corresponds to the second group of wordlines associated with the second deck.

5. The system of claim 1, wherein the memory access operation comprises a program verify operation or a read operation.

6. The system of claim 1, wherein the processing device is to perform operations further comprising:
determining that an adaptive time sense configuration is enabled.

7. The system of claim 1, wherein the processing device is to perform operations further comprising:
determining that an adaptive time sense configuration is disabled; and
performing the memory access operation on the set of cells associated with the wordline using a default time sense parameter.

8. A method comprising:
receiving a request to perform a memory access operation on a set of cells associated with a wordline of a memory device;
determining that the wordline is disposed on a first deck of the memory device;
responsive to determining that the wordline is disposed on the first deck, determining that the wordline is associated with a first group of wordlines associated with the first deck;
identifying a first overdrive voltage parameter assigned to the first group of wordlines associated with the first deck, wherein the first overdrive voltage parameter is assigned to the first group of wordlines based on a read window budget (RWB) associated with the first group of wordlines; and
performing the memory access operation on the set of cells associated with the wordline using the first overdrive voltage parameter.

9. The method of claim 8, further comprising:
determining that the wordline is associated with a second group of wordlines associated with the first deck; and
responsive to determining that the wordline is associated with the second group of wordlines associated with the first deck, performing the memory access operation on the set of cells associated with the wordline using a second overdrive voltage parameter, wherein the second overdrive voltage parameter corresponds to the second group of wordlines associated with the first deck.

10. The method of claim 8, further comprising:
determining that the wordline is disposed on a second deck of the memory device; responsive to determining that the wordline is disposed on the second deck, determining that the wordline is associated with a first group of wordlines associated with the second deck; and
responsive to determining that the wordline is associated with the first group of wordlines associated with the second deck, performing the memory access operation on the set of cells associated with the wordline using a third overdrive voltage parameter, wherein the third overdrive voltage parameter corresponds to the first group of wordlines associated with the second deck.

11. The method of claim 10, further comprising:
determining that the wordline is associated with a second group of wordlines associated with the second deck; and
responsive to determining that the wordline is associated with the second group of wordlines associated with the second deck, performing the memory access operation on the set of cells associated with the wordline using a fourth overdrive voltage parameter, wherein the fourth overdrive voltage parameter corresponds to the second group of wordlines associated with the second deck.

12. The method of claim 8, wherein the memory access operation comprises a read operation.

13. The method of claim 8, further comprising:
determining that an adaptive overdrive voltage configuration is enabled.

14. The method of claim 8, further comprising:
determining that an adaptive overdrive voltage configuration is disabled; and
performing the memory access operation on the set of cells associated with the wordline using a default overdrive voltage parameter.

15. A non-transitory computer-readable storage medium comprising instructions that, when executed by a processing device, cause the processing device to perform operations comprising:
receiving a request to perform a memory access operation on a set of cells associated with a wordline of a memory device;
determining that the wordline is disposed on a first deck of the memory device;
responsive to determining that the wordline is disposed on the first deck, determining that the wordline is associated with a first group of wordlines associated with the first deck;
identifying a first time sense parameter assigned to the first group of wordlines associated with the first deck, wherein the first time sense parameter is assigned to the first group of wordlines based on a read window budget (RWB) associated with the first group of wordlines; and
performing the memory access operation on the set of cells associated with the wordline using the first time sense parameter.

16. The non-transitory computer-readable storage medium of claim 15, wherein the processing device is to perform operations further comprising:
determining that the wordline is associated with a second group of wordlines associated with the first deck; and
responsive to determining that the wordline is associated with the second group of wordlines associated with the first deck, performing the memory access operation on the set of cells associated with the wordline using a second time sense parameter, wherein the second time sense parameter corresponds to the second group of wordlines associated with the first deck.

17. The non-transitory computer-readable storage medium of claim 15, wherein the processing device is to perform operations further comprising:
determining that the wordline is disposed on a second deck of the memory device;
responsive to determining that the wordline is disposed on the second deck, determining that the wordline is associated with a first group of wordlines associated with the second deck; and
responsive to determining that the wordline is associated with the first group of wordlines associated with the second deck, performing the memory access operation on the set of cells associated with the wordline using a third time sense parameter, wherein the third time sense parameter corresponds to the first group of wordlines associated with the second deck.

18. The non-transitory computer-readable storage medium of claim 17, wherein the processing device is to perform operations further comprising:
determining that the wordline is associated with a second group of wordlines associated with the second deck; and
responsive to determining that the wordline is associated with the second group of wordlines associated with the second deck, performing the memory access operation on the set of cells associated with the wordline using a fourth time sense parameter, wherein the fourth time sense parameter corresponds to the second group of wordlines associated with the second deck.

19. The non-transitory computer-readable storage medium of claim 15, wherein the processing device is to perform operations further comprising:
determining that an adaptive time sense configuration is enabled.

20. The non-transitory computer-readable storage medium of claim 15, wherein the processing device is to perform operations further comprising:
determining that an adaptive time sense configuration is disabled; and
performing the memory access operation on the set of cells associated with the wordline using a default time sense parameter.

* * * * *